United States Patent [19]

Dirksen

[11] 4,166,947
[45] Sep. 4, 1979

[54] TTL COMPATIBLE LED DRIVER CIRCUIT

[75] Inventor: Jerome P. Dirksen, St. Paul, Minn.

[73] Assignee: Minnesota Mining and Manufacturing Company, Saint Paul, Minn.

[21] Appl. No.: 850,248

[22] Filed: Nov. 10, 1977

[51] Int. Cl.² ............................ H04B 9/00; H01S 3/10
[52] U.S. Cl. .................................... 250/199; 307/312; 315/200 R; 332/7.51
[58] Field of Search ...................... 250/199; 332/7.51; 315/200 R; 307/311, 312

[56] References Cited

U.S. PATENT DOCUMENTS

| | | | |
|---|---|---|---|
| 3,258,596 | 6/1966 | Green | 332/7.51 |
| 3,341,708 | 9/1967 | Bilderback | 332/7.51 |
| 3,488,586 | 1/1970 | Watrous et al. | 250/199 |
| 3,577,017 | 5/1971 | Duke | 307/312 |
| 3,806,762 | 4/1974 | Punis et al. | 332/7.51 |
| 3,968,399 | 7/1976 | Jarrett | 315/200 R |

*Primary Examiner*—Robert L. Griffin
*Assistant Examiner*—Joseph A. Orsino, Jr.
*Attorney, Agent, or Firm*—Cruzan Alexander; Donald M. Sell; William B. Barte

[57] ABSTRACT

A circuit is disclosed for use in optical fiber data communication systems which is compatible with TTL digital input signals and which drives a light emitting diode (LED) coupled to an optical fiber transmission link. A pulse shaping network is provided to couple current from a constant current source to energize the LED or to a bank of open collector NAND gates controlled by the input digital signal such that the current may be selectively shunted around the LED.

7 Claims, 3 Drawing Figures

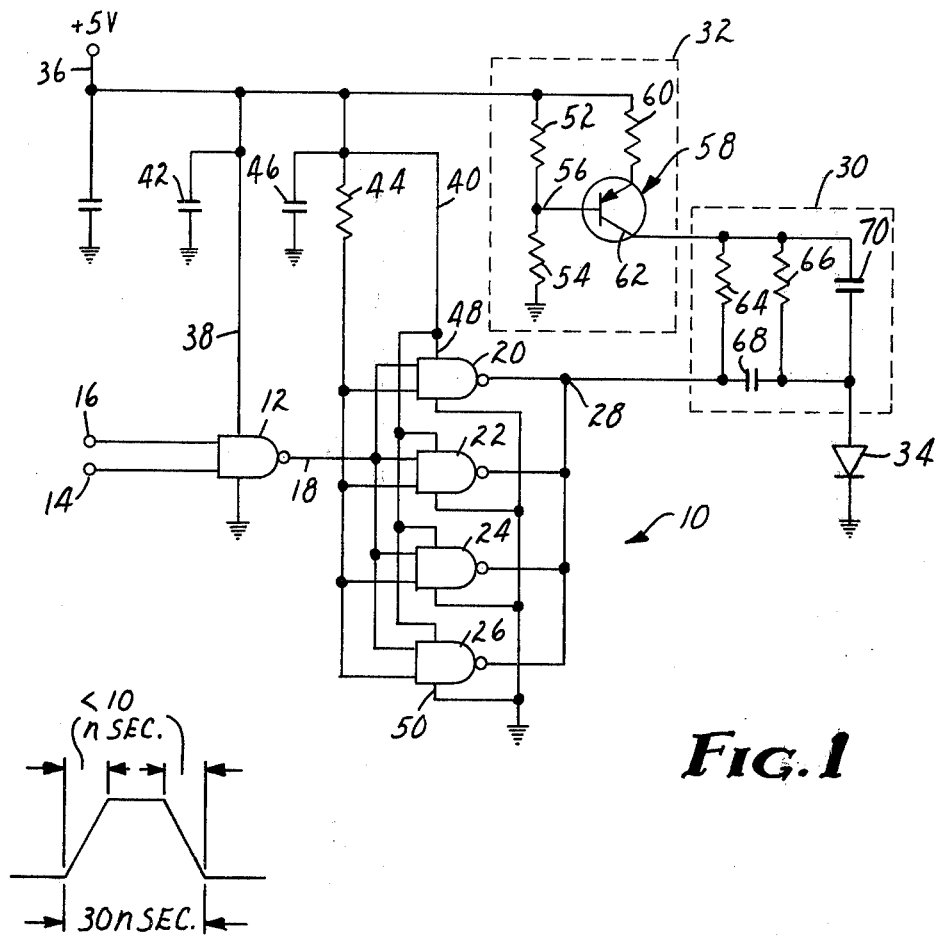
FIG.1
FIG.2
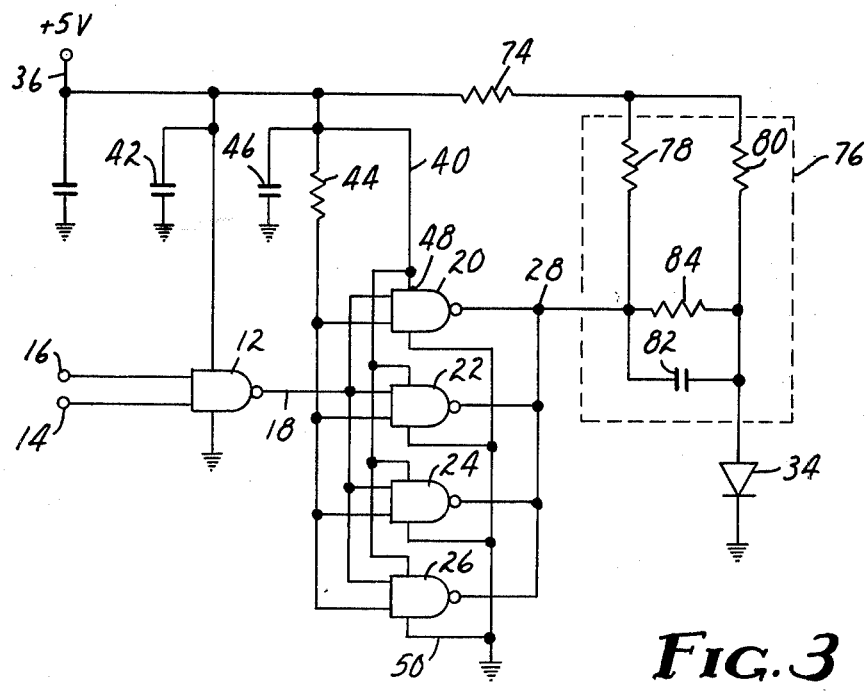
FIG.3

TTL COMPATIBLE LED DRIVER CIRCUIT

BACKGROUND OF THE INVENTION

(1) Field of the Invention

The present invention relates to optoelectronic data communications systems, and in particular to such systems where digital data is transmitted via TTL compatible circuits to drive a light emitting diode (LED) at high frequencies, and in which the LED is coupled to an optical fiber to transmit optical pulses corresponding to digital input signals to an optoelectronic receiver at the other end of the fiber.

(2) Description of the Prior Art

Interference-free optoelectronic data transmission systems as a means for transmitting information have been considered for approximately the past 25 years. During the research and development phases of practical systems, a great deal of effort has been directed toward economic production of rugged fibers, low voltage photodetectors, long life light sources and reliable connectors. However, as these problems have been solved, more attention has been directed toward a practical and efficient means of interfacing these optical systems with the electronic systems that constitute the rest of the total information transmitting system.

A particularly troublesome problem relating to such interfaces relates to the aspect of driving a suitable light source such as an LED at high frequencies in response to a conventionally encoded input digital signal. One approach to providing an LED driver circuit is disclosed in U.S. Pat. No. 3,968,399 (Jarrett), in which emitter coupled logic (ECL) gates are utilized. While such an approach enables high frequency energization of LED's, it requires both positive and negative power supplies and is not directly compatible with TTL logic signals most often encountered in data communication systems. While some circuits are known for driving LED's using TTL gates, it is not known to provide a simple and inexpensive means enabling 30 MHz bandwidth. See "Optoelectronics and interface Electronics", P. W. Casper, SPIE Vol. 63 (1975) Guided Optical Communications, pp. 19–27, at page 21. Circuits such as there set forth produce significant current overshoots, i.e., up to 25%, particularly in the trailing edge of LED energization pulses, with attendant "ringing", such that the LED may not be properly de-energized between successive pulses, resulting in erroneous signal transmissions.

SUMMARY OF THE INVENTION

In contrast to such prior art circuits in which appreciable current overshoots and ringing limits the practical rate at which error free modulation of an LED can be achieved using a simple and inexpensive circuit, the circuit of the present invention enables an LED in an optoelectronics telecommunications system to be driven at a frequency of 30 MHz without ringing or other effects which delay the rise and decay times of energization pulses, such that the LED is reliably de-energized between successive pulses. The circuit enables driving an inexpensive LED with currents of at least 200 ma and utilizes conventional, inexpensive TTL compatible components. The circuit is provided with means for receiving TTL compatible digital input signals, such as a dual input NAND gate, one input of which is coupled to an enable control signal to provide an inverted TTL output signal.

The received signal, preferably in inverted form, is in turn coupled to switch means having high and low digital output states, which states are controlled by the states of the received signal. Means are also provided for coupling a source of current to energize the LED in the system. Means for coupling the current source providing means, the switch means and the LED are included for shunting the current from the current source through the switch means when in its low digital output state to de-energize the LED, and for coupling current from the source to energize the LED when the switch means is in its high digital output state. The coupling means includes a pulse shaping network comprising a first resistor connected between the current source providing means and the switch means, a second resistor connected between the current source providing means and the LED and a capacitor connected between the switch means and the LED. The components of the network are selected to couple the current to energize the LED in pulses corresponding to the input signals at a drive frequency up to 30 MHz such that the rise and decay times of the coupled pulses are sufficiently short to enable energization and de-energization of the LED at the drive frequency.

In a preferred embodiment a constant current source capable of outputting 275 ma is provided, in which event the coupling network further includes an additional coupling capacitor between the source and the LED. LED energization pulses having substantially equal rise and decay times of less than 10 n sec and which are substantially free of ringing on both the leading and trailing edges are thus provided.

BRIEF DESCRIPTION OF THE DRAWING

FIG. 1 is a circuit diagram of a preferred embodiment of the present invention;

FIG. 2 is a wave shape of a typical TTL logic signal processed in the circuit shown in FIG. 1; and FIG. 3 is a circuit diagram of another embodiment of the present invention.

DESCRIPTION OF THE PREFERRED EMBODIMENTS

FIG. 1 shows a schematic diagram of a TTL compatible LED driver circuit 10 according to a preferred embodiment of the present invention. In this circuit, a conventional NAND gate 12 is provided to receive an incoming TTL compatible digital signal on lead 14 from an information bearing interface. The other input to the gate 12 is provided with enable signals on lead 16 from suitable clocking and control networks to enable a digital input signal on lead 14 to be inverted and to be coupled through gate 12 to an output terminal 18 as appropriate. The inverted output is coupled in parallel to one of the inputs of 4 NAND buffer gates having open collector outputs identified as elements 20, 22, 24 and 26. The outputs of the paralleled NAND gates are coupled together at node 28 to drive the pulse shaping network 30. The network 30 is in turn supplied by current from a constant current source 32 so as to provide an output to controllably energize a light emitting diode 34 such as a Type FPE 104 emitter diode at the output from the pulse shaping circuit 30. The constant current source 32 is in turn energized by a suitable +5 volt source on lead 36, which supply further energizes the NAND gate 12 via lead 38, and the paralleled NAND buffer gates 20, 22, 24 and 26 via lead 40.

The input portions of the circuit 10 thus functions such that when a digital input signal is present at lead 14, the signal is coupled into one input of the dual input NAND gate 12, such as a Type 74S00 gate, a logical inversion results. I.e., when a digital 0 appears at input 14 a digital 1 appears at the output 18 and conversely when a digital 1 appears at terminal 14, it is converted into a digital 0 at terminal 18. The other input to the gate 12 at terminal 16 is used to enable the input, such that when 0 volts is provided at terminal 16, no data transmission occurs. Conversely, if a positive digital 1 signal (+5 volts) is applied to terminal 16, then data transmission is allowed to occur through the NAND gate 12. The +5 volt source on lead 38 is also protected via the bypass capacitor 42 to filter out noise from the power supply line.

The digital signal appearing at the output 18 of the NAND gate 12 is coupled to one input of each of the four paralleled NAND buffer gates, such as a quad input NAND buffer gate Type 74S38 having open collector outputs. The other input of each of the gates 20, 22, 24 and 26 is connected to the +5 volt source 36 through a current limiting resistor 44 and a bypass capacitor 46 to further filter out noise from the power supply line 36. In the event the gates 20, 22, 24 and 26 are included within a single IC chip, the power supply voltage may be applied at a single input terminal such as at terminal 48, and may be commonly grounded via a ground terminal 50.

The constant current source 32 is of conventional design, and includes a voltage divider network comprising resistors 52 and 54 connected between the input power supply at terminal 36 and ground, so as to provide at node 56 a fixed potential slightly less than 2.5 volts. Typically, for example, resistor 52 may have a value of 180 ohms while resistor 54 has a value of approximately 150 ohms. The node 56 is then coupled to the base of a pnp transistor 58 such as Type 2N5160. The emitter of the transistor 58 is coupled to the power supply at terminal 36 through a biasing resistor 60, which typically may have a value of 3.3 ohms. When so configured, a constant current of approximately 275 ma is provided at the collector of transistor 58 (i.e., at terminal 62) regardless of changes in the output impedance at that point. The constant current supply 32 further acts as an effective filter for preventing propagation of noise spikes provided upon switching of the buffer gates 20, 22, 24 and 26 back into the operating voltage supply line 36.

The pulse shaping network 30 is shown in FIG. 1 to consist of current limiting resistors 64 and 66 together with pulse shaping capacitors 68 and 70. In the preferred embodiment shown in FIG. 1, the resistors 64 and 66, respectively, are each 3 ohms, while capacitor 68 is selected to have a capacitance of 390 pf and capacitor 70 a capacitance of 0.001 µf. When the current from the constant current supply 32 is selectively switched in accordance with the digital high state of the NAND buffer gate 20-26, approximately 200 milliamps of the constant current from source 32 is directed through the LED 34, while the remaining current of approximately 75 milliamps flows through the NAND buffer gates 20-26. In contrast, when the buffer gates are in a digital low state, essentially all of the current is shunted through the buffer gates and the LED 34 remains unenergized. While in the embodiment shown in FIG. 1 NAND buffer gates with open collector outputs are utilized such that the outputs may be tied together to provide parallel sinks for the current needed to adequately modulate the LED, other digital switching circuits may likewise be employed. The use of such paralleled, open-collector, buffer gates permits the utilization of the pulse shaping network 30 in place of a conventional current limiting resistor configuration.

When the pulse shaping network as shown in FIG. 1 is employed, and digital pulses having Schottky TTL rise and decay times, typically less than 5 n sec, are applied at input terminal 16, such as, for example, that provided at 10 MHz clock rate, such that a digital bit capacity of 20 megabits per second may be transmitted, the output current pulse modulating the LED 34 is substantially as shown in FIG. 2. It may there be noted that under such conditions, the pulse duration may be approximately 30 nanoseconds, and that the rise and decay times for such a pulse are substantially the same, and are less than 10 nanoseconds in duration.

An alternative embodiment of the present invention is shown in the schematic diagram of FIG. 3. In this circuit, the NAND signal inverting gate 12, the parallel NAND buffer gates 20 through 26, and the associated energization circuit components are desirably the same as that shown in FIG. 1. However, in this embodiment, the constant current supply of FIG. 1 is replaced with a single current limiting resistor 74, such as preferably a 9 ohm resistor. Current provided from the source supply line 36 through the resistor 74 is then coupled to the LED 34 or is shunted through the buffer gates 20 through 26, as in the embodiment shown in FIG. 1. The current shaping network 76 of this embodiment is composed of resistors 78 and 80 and a capacitor 82 which are functionally equivalent to the resistors and capacitors 64, 66 and 68 of the pulse shaping network of FIG. 1. In this embodiment, however, the resistors each are selected to have resistances of 9 ohms, while capacitor 82 has a capacitance of 470 pf. The network 76 further includes an additional 12 ohm resistor 84 in parallel with the capacitor 82. The network 76 thus shapes current selectively switched either through the LED 34 or shunted through the paralleled buffer gates 20-26, and produces a current pulse through the LED substantially as shown in FIG. 2.

In either of the embodiments shown in FIGS. 1 and 3 above, the current pulse is shaped such that the rise and fall times are substantially equal and have a duration of at least less than 10 nanoseconds. These circuits, when utilized to drive an LED such as a Fairchild Type FEP 104 light emitting diode, produce a light pulse which is free of any significant (i.e., less than 5%) pulse ringing.

In the above description, it is apparent that practical, useful and novel circuits are disclosed which are TTL compatible, and which enable driving an LED at high speed. While the invention has been disclosed with respect to certain embodiments, it is obvious that additional modifications and variations may be made within the spirit and scope of the present invention.

I claim:

1. A circuit adapted for high frequency pulsed energization of a light emitting diode (LED) such as may be coupled to transmit light into an optical fiber providing a light transmission link in an optoelectronic telecommunications system, said circuit comprising:
   (a) means for receiving TTL compatible digital input signals;

(b) means for providing a source of current to energize said LED;

(c) switch means coupled to said receiving means and having high and low digital output states to which it is switched in response to a said received TTL compatible signal; and (d) means for coupling said current source providing means, said switch means and said LED such that current from said source is shunted through said switch means when in its low digital output state to de-energize the LED and such that current from said source is coupled to energize the LED when said switch means is in its high digital output state, said coupling means including a pulse shaping network comprising a first resistor connected between said current source providing means and said switch means, a second resistor connected between said current source providing means and the LED and a capacitor connecting said switch means and the LED, the resistors and capacitor being selected to couple current pulses to energize the LED at a drive frequency up to 30 MHz such that the rise and decay times of the coupled pulses are sufficiently short to enable energization and de-energization of the LED at said drive frequency.

2. A circuit according to claim 1, wherein said current source providing means comprises means for providing a source of constant current, and said pulse shaping network further includes another capacitor connected in parallel with said second resistor and between the constant current providing means and the LED selected to provide an energization pulse to the LED having a rise and decay time of not more than 10 nanoseconds and which is substantially free of ringing on both the leading and trailing edges.

3. A circuit according to claim 2, wherein said means for providing a constant current comprises a transistor having its base and emitter coupled to fixed potentials and its collector connected to provide an output terminal such that despite changes in the output impedance at the collector, the current conducted through the transistor is maintained constant.

4. A circuit according to claim 1, wherein said current source providing means comprises means for providing a current of at least 250 milliamperes to said pulse shaping network and said pulse shaping network further includes a third resistor parallel with said capacitor to provide an energization pulse to the LED having a rise and decay time of not more than 10 nanoseconds and which is substantially free of ringing on both the leading and trailing edges.

5. A circuit according to claim 1, wherein said switch means comprises a plurality of NAND buffer gates having open collector outputs which are connected together and coupled to pass current from said current source providing means through the gates to ground when in said low digital state and to inhibit said current flow therethrough when in said high digital state such that said current is then forced to flow through said LED.

6. A circuit according to claim 1, wherein said receiving means includes means for inverting said input TTL compatible signals to cause a given state in the input signal, such as a digital 1, to result in the energization of the LED during a like interval.

7. An optical fiber data communications system comprising an optical fiber providing a light transmission link, a light emitting diode (LED) coupled to transmit light into said optical fiber and a circuit for high frequency pulsed energization of said LED, said circuit including (a) means for receiving TTL compatible digital input signals;

(b) means for providing a source of current to energize said LED;

(c) switch means coupled to said receiving means and having high and low digital output states to which it is switched in response to a said received TTL compatible signal; and (d) means for coupling said current source providing means, said switch means and said LED such that current from said source is shunted through said switch means when in its low digital output state to de-energize the LED and such that current from said source is coupled to energize the LED when said switch means is in its high digital output state, said coupling means including a pulse shaping network comprising a first resistor connected between said current source providing means and said switch means, a second resistor connected between said current source providing means and the LED and a capacitor connecting said switch means and the LED, the resistors and capacitor being selected to couple current pulses to energize the LED at a drive frequency up to 30 MHz such that the rise and decay times of the coupled pulses are sufficiently short to enable energization and de-energization of the LED at said drive frequency.

* * * * *